United States Patent
Bratkovski et al.

(10) Patent No.: US 7,991,253 B2
(45) Date of Patent: Aug. 2, 2011

(54) MEMRISTIVE ARRAY WITH WAVEGUIDE

(75) Inventors: Alexandre M. Bratkovski, Mountain View, CA (US); Sagi V. Mathai, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 179 days.

(21) Appl. No.: 12/433,834

(22) Filed: Apr. 30, 2009

(65) Prior Publication Data

US 2010/0278479 A1    Nov. 4, 2010

(51) Int. Cl.
*G02B 6/26* (2006.01)
(52) U.S. Cl. .......................................................... 385/31
(58) Field of Classification Search .................. None
See application file for complete search history.

(56) References Cited

U.S. PATENT DOCUMENTS

| 7,704,789 B2 * | 4/2010 | Sun et al. ................... 438/104 |
| 2006/0245243 A1 * | 11/2006 | Rinerson et al. ............ 365/171 |
| 2008/0079029 A1 * | 4/2008 | Williams ...................... 257/213 |
| 2008/0090337 A1 * | 4/2008 | Williams ...................... 438/133 |
| 2010/0183260 A1 * | 7/2010 | Rockwell et al. ............ 385/39 |
| 2010/0265552 A1 * | 10/2010 | Wang et al. .................. 359/9 |
| 2010/0272386 A1 * | 10/2010 | Fu et al. ...................... 385/14 |
| 2010/0278474 A1 * | 11/2010 | Beausoleil et al. ........... 385/2 |

FOREIGN PATENT DOCUMENTS

WO    WO 2010071635 A1 *    6/2010

OTHER PUBLICATIONS

Zia, Rashid et al., "Dielectric Waveguide Model for Guided Surface Polaritons" Optics Letters, vol. 30, No. 12, pp. 1473-1475 (Jun. 15, 2006).

Zia, Rashid et al., "Plasmonics: the next chip scale technology" Materialstoday, vol. 9, No. 7-8, pp. 20-27 (Jul.-Aug. 2006).

* cited by examiner

*Primary Examiner* — Sung Pak

(57) ABSTRACT

A device includes one or more waveguides and a memristive array adjacent to the waveguide(s). The memristive array is programmable to form a pattern that diffracts light and couples diffracted light into or out of the waveguide(s).

12 Claims, 2 Drawing Sheets

MEMRISTIVE ARRAY WITH WAVEGUIDE

BACKGROUND

Modulation of a light beam can be used to create an optical signal that represents digital or analog information. A common technique for such modulation is external modulation, which uses a light source such as a stabilized laser to generate a constant light beam and an optical modulator to alter or modulate a property of the light beam. Typically, the amplitude, phase, or polarization of the beam is modulated to represent the information being conveyed in the optical signal. Light from the light source or the optical modulator can be coupled into a waveguide for guided signal transmission before or after modulation.

A variety of devices and techniques are known for both modulation of an optical signal and coupling of an optical signal into a waveguide. For example, two common types of modulators are acousto-optic modulators and electro-optic modulators. An acousto-optic modulator (AOM), which is sometimes called a Bragg cell, uses the acousto-optic effect where sound waves cause variations in the refractive index of a material, and the variations diffract light passing through the material. The intensity of light at a specific angle of diffraction thus varies, i.e., is modulated according to changes in the acoustic signal. Electro-optic modulators similarly use the electro-optic effect to modulate the intensity of light at a target angle of diffraction. Optical couplers typically employ optical elements to focus light beam on to an end of a waveguide and are often needed for the transition of an optical signal between a device such as an optical modulator and a waveguide through which the optical signal is transmitted (i.e., to couple light in or out).

BRIEF DESCRIPTION OF THE DRAWINGS

Use of the same reference symbols in different figures indicates similar or identical items.

DETAILED DESCRIPTION

In accordance with an aspect of the invention, a device uses a memristive array to form a diffractive optical element that couples light into or out of a waveguide. Further, the pattern of variations in an optical property in the memristive array can be switched on and off or otherwise changed to control the efficiency with which the incident light is coupled into or out of the waveguide. Accordingly, the device can act as an optical modulator capable of modulating the light signal. Such devices can also be used to selectively filter incident light by only coupling light of a desired frequency into the waveguide or extracting a frequency component from a waveguide. In accordance with a further aspect of the invention, the device can include a gain medium to amplify the light that is coupled into the waveguide.

Figure 1:
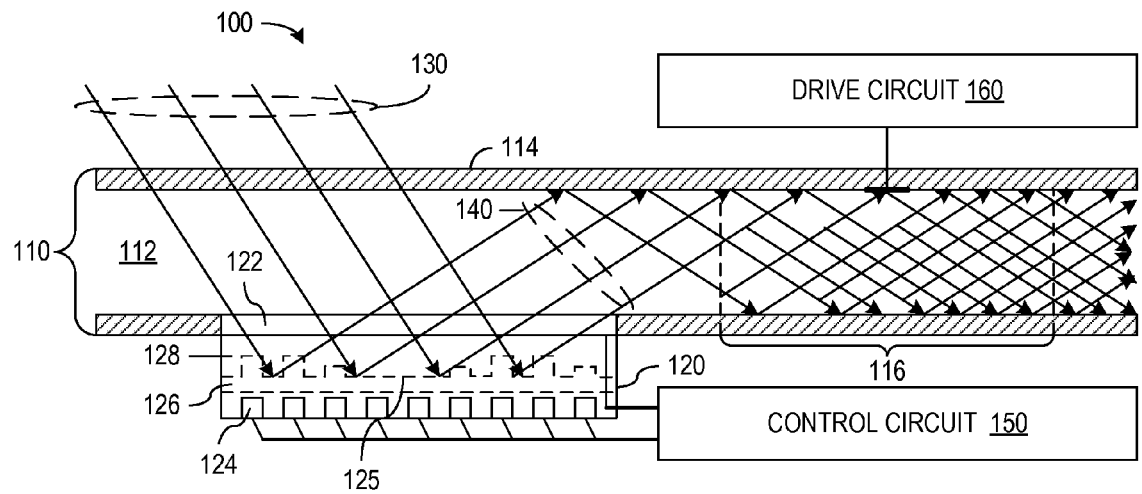
FIG. 1 shows a cross-sectional view of a coupler/modulator in accordance with an embodiment of the invention.

FIG. 1 shows a cross-section of a device 100 in accordance with an embodiment of the invention. Device 100 includes a waveguide 110 and a memristive array 120 that acts as a programmable diffractive optical element. Waveguide 110 can be a conventional optical waveguide that includes a core 112 and cladding 114 that surrounds core 112. As is well known, cladding 114 is made of a material having a refractive index that is lower than the refractive index of core 112, so that light can be kept and guided in core 112 through total internal reflection. Waveguide 110 (and memristive array 120) can be fabricated as part of an integrated structure using materials that are suitable for the wavelength of the light to be used. For example, core 112 of waveguide 110 can be made of silicon if waveguide 110 is designed for infrared light or can be silicon nitride if waveguide 110 is designed for visible light. Cladding 114 can be a lower refractive index material such as silicon dioxide, a polymer, or air.

Incident light 130 from a source (not shown) such as a laser passes through waveguide 110 and is incident on memristive array 120 in the embodiment of FIG. 1. Memristive array 120 can alternatively be placed on top of the waveguide 110 or in the same plane as the waveguide 110. In each case, incident light 130 may be at an incident angle at which light is not coupled or is poorly coupled into waveguide 110. However, memristive array 120 has electrical and optical properties that can be programmed to vary in a pattern that diffracts light at an angle such that diffracted light 140 is efficiently coupled into waveguide 110. Further, in embodiments of the invention including multiple waveguides adjacent to memristive array 120, memristive array 120 can simultaneously diffract light from incident beam 130 into the multiple waveguides.

Memristive array 120 is an array of areas or devices having a programmable electrical and optical property. The programmable areas or devices of memristive array 120 can be made smaller than the wavelength of incident light 130 and thus can form patterns that diffracts incident light 130. U.S. Pat. App. Pub. No. 2008/0090337, entitled "Electrically Actuated Switch," to R. Stanley Williams describes some suitable memristive devices and fabrication techniques for such devices and is hereby incorporated by reference in its entirety. In the embodiment of FIG. 1, memristive array 120 has a crossbar structure including x-wires 122 that are perpendicular y-wires 124. Y-wires 124 are in a bottom layer of memristive array 120 in the illustrated configuration but could alternatively be in the top layer without changing the function of memristive array 120. The x-wires and y-wires are substantially perpendicular to each other. Between x-wires 122 and y-wires 124 are a layer 126 of source material and a layer 128 of primary material. The primary material is generally a material that provides mobility to charged dopants from the source material, where the mobility of dopants in the primary material is such that an applied electric field of sufficient magnitude can drive some of the dopants from the source material layer 126 into the primary material 128 (or drive the dopants out of the primary material layer 128 into the source material layer 126.) The primary material is also such that the introduction of the dopants changes electrical and optical properties of the primary material.

An exemplary primary/source material combination is titanium dioxide ($TiO_2$) and oxygen depleted titanium dioxide ($TiO_{2-x}$). $TiO_2$ is a wide-band semiconductor in its intrinsic state but becomes a narrow-band semiconductor when oxygen vacancies are introduced. An applied electric field (i.e., a voltage difference between a selected x-wire 122 and a selected y-wire 124) that drives oxygen vacancies from the source material ($TiO_{2-x}$) into the primary material ($TiO_2$) can thus significantly increase the conductivity and change the electrical permittivity and refractive index of the primary material in the area where the x-wire and y-wire cross. Similarly, an electric field that drives oxygen vacancies from the primary material (TiO$_2$) back into the source material (TiO$_{2-x}$) can significantly decrease the conductivity and reverse the change in the electrical permittivity and refractive index of the primary material. FIG. 1 shows a contour or pattern 125 to illustrate an example of how the refractive index can vary in different regions along the illustrated cross-section. When the combination of layers 126 and 128 is on the order of hundreds or tens of nanometers thick, the change in optical properties can generally be switched in times on the order of milliseconds to nanoseconds. Some other combinations of primary/source materials suitable for layer 128 and 126 include: ZrO$_2$/ZrO$_{2-x}$, HfO$_2$/HfO$_{2-x}$, and SrTiO$_3$/SrTiO$_{3-x}$ which use oxygen vacancies as mobile dopants; GaN/GaN$_{1-x}$, which uses nitrogen vacancies as mobile dopants; CuCl/CuCl$_{1-x}$, which uses chlorine vacancies as mobile dopants; GaN/GaN:S, which uses sulfide ions as mobile dopants; and amorphous silicon and silver (a-Si/Ag), which uses the mobility of silver ions.

A control circuit 150 connected to x-wires 122 and y-wires 124 can independently drive electrical signals on x-wires 122 and y-wires 124 to program or otherwise set the pattern 125 of variation in memristive array 120. In particular, a voltage difference between a selected x-wire 122 and a selected y-wire 124 creates an electric field in the areas where the selected wires cross and overlap, and that electric field can cause charged dopants to move in a localized region of layers 126 and 128. The dopant movement changes the electrical conductivity and permittivity in the area where the selected wires overlap. Using currently available techniques, x-wires 122 and y-wires 124 can be fabricated with widths down to about 10 nm, so areas as small as 10 nm×10 nm at the crossing points of x-wires 122 and y-wires 124 can have electrical permittivities individually set. Such areas are smaller than wavelengths of ultraviolet light and generally can be used to create patterns that diffract light having a wavelength longer than the width of wires 122 and 124. Generally, a patch containing multiple cross-points where x-wires 122 cross y-wires 124 can form a "pixel" that is programmed as a unit when creating a pattern 125. Normally, one does not need pixels that are so much smaller than the wavelength of the diffracted light. Programmable areas that are about one fifth to one tenth of a wavelength would generally be sufficient. For communication frequencies using a wavelength of about 1.5 microns that would translate into 150-300 nm widths. For visible light, widths may be about three times smaller than that, or about 50-100 nm. For a wavelength longer than the wire or pixel width, a pattern can be created in memristive array 120 that has a maximum for diffracted light 140 at a suitable angle for coupling light into waveguide 110. In general, the required pattern in memristive array 120 will depend on the wavelength and the angle of incidence of incident light 130. Accordingly, device 100 can be used as an optical coupler that is able to couple light into waveguide 110, and as an optical coupler that is tunable to the wavelength and incident angle of incident light 130. Device 100 can also select the polarization of light that is coupled into the waveguide or operate as a polarization independent grating coupler. Device 100 can also be programmed to have a narrow bandwidth or a wide bandwidth.

Although FIG. 1 shows light paths for light being coupled into waveguide 120, the same structure can alternatively be used to extract (or couple out) light from waveguide 120. Device 100 can also operate as an optical modulator since the pattern 125 of variation in memristive array 120 can be changed at high frequency, e.g., frequencies in the MHz to several GHz range. For operation as a modulator, control circuit 15 can receive input data and determine the modulation required to encode the data in an optical signal. Control circuit 150 then applies electrical signals to x-wires 122 and y-wires 124 to change pattern 125 and thus change diffracted light 140. For example, the change in pattern 125 can change the angle corresponding to the maxima of diffracted light 140 to alter the efficiency with which diffracted light 140 couples into waveguide 110 or alternatively can change the strength of the diffraction without changing the angle corresponding to the maxima.

In accordance with a further aspect of the invention, device 100 can include a gain medium 116 that amplifies diffracted light 140 into waveguide 110. In the embodiment of FIG. 1, gain medium 116 is part of the core 112 of waveguide 110. Alternatively, some types of gain medium (e.g., quantum dots and quantum wells) may be incorporated in memristor array 120 or adjacent to memristive array 120. Gain medium 116 can be made of a material capable of stimulated emissions of light of the desired frequency for the optical signal. For example, gain medium 115 can be semiconductor material such as gallium arsenide (GaAs), indium gallium arsenide (InGaAs), gallium nitride (GaN), or other suitable semiconductor material that is doped such that an electrical current that a drive circuit 160 drives through gain medium 116 causes a population inversion in gain medium 116, and stimulated emissions result from electron state transitions when diffracted light 140 passes through gain medium 116. In other embodiments of the invention, gain medium 116 can contain quantum wells or similar structures that are well known in the field of semiconductor lasers and optical amplifiers as mechanisms for coupling energy from a drive current into an electromagnetic mode. Yet other structures such as quantum dots could be used in gain medium 116 for conversion of electrical energy into amplification of the optical signal. Alternatively, gain medium 116 can be pumped using an optical energy source such as a laser, LED, or lens-focused flash lamp that directs light through gain medium 116.

Figure 2A:
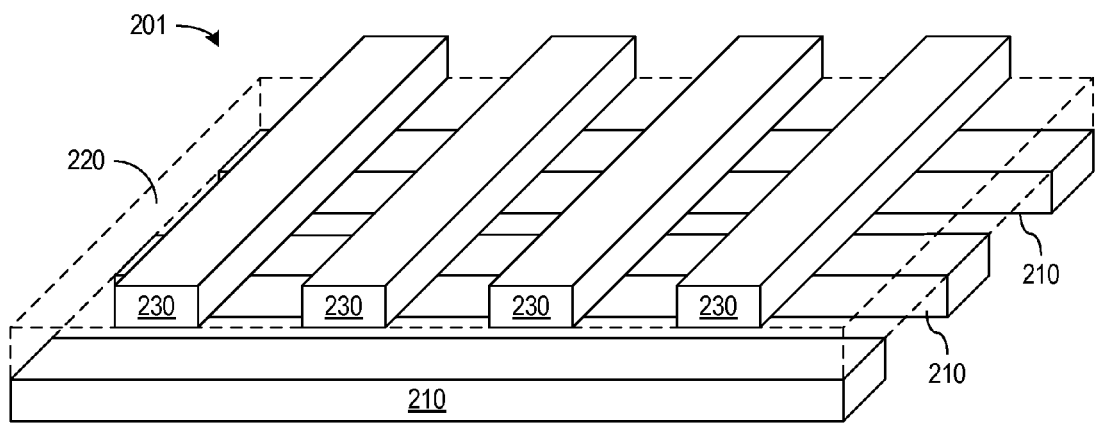
FIGS. 2A and 2B show memristive arrays capable of operating as programmable two-dimensional diffractive optical elements in couplers/modulators in accordance with an embodiment of the invention.

Memristive array 120 of device 100 can employ a variety of different structures that function as a programmable diffractive optical element. FIG. 2A, for example, illustrates a memristive array 201 that is substantially of the type described with reference to FIG. 1. Memristive array 201 includes bottom wires 210 that are made of a conductive material such as Cu, Al, Au, or other metal or a transparent conductor such as indium tin oxide (ITO). Bottom wires 210 would typically (but are not required to) run either substantially parallel or perpendicular to the direction of light propagation in a waveguide. Each bottom wire 210 may have a width of about 10 nm. Wider bottom wires 210 can be used, but the wavelength of the light to be diffracted is preferably longer than the width of each bottom wires 210. Narrower bottom wires 210 may also be used, provided that available fabrication techniques can achieve the narrower widths. Spaces between x-wires 210 are filled with insulator to electrically isolate x-wires 210 from each other. The widths of intervening insulator in the bottom layer can be the minimum achievable that is able to provide the desired electrical isolation between bottom wires 210.

A memristive layer 220 overlies bottom wires 210. Memristive layer 220 generally includes a layer of a primary material such as TiO$_2$ and a layer of source material such as TiO$_{2-x}$. The overall thickness of memristive layer 220 influences the speed with which the properties of memristive layer 220 can be switched, so that a thickness of about 50-100 nm is generally desired. In memristive array 201, memristive layer 220 is a blanket or unpatterned layer that extends continuously over all bottom wires 210.

Top wires 230 are formed on memristive layer 220 and in a typical embodiment have the same width and pitch as bottom wires 210, but top wires 230 generally run perpendicular to bottom wires 210. With this configuration, the refractive index of regions of memristive layer 220 at crossing points of top wires 230 and bottom wires 210 can be altered to form variations that diffract light. To minimize the effects or loss that top wires 230 may cause on incident light, top wires 230 may be formed of a transparent conductive material such as Indium Tin Oxide (ITO), so that incident light is transmitted through top wires 230 to interact with and be diffracted by the variations in memristive layer 220.

Figure 2B:
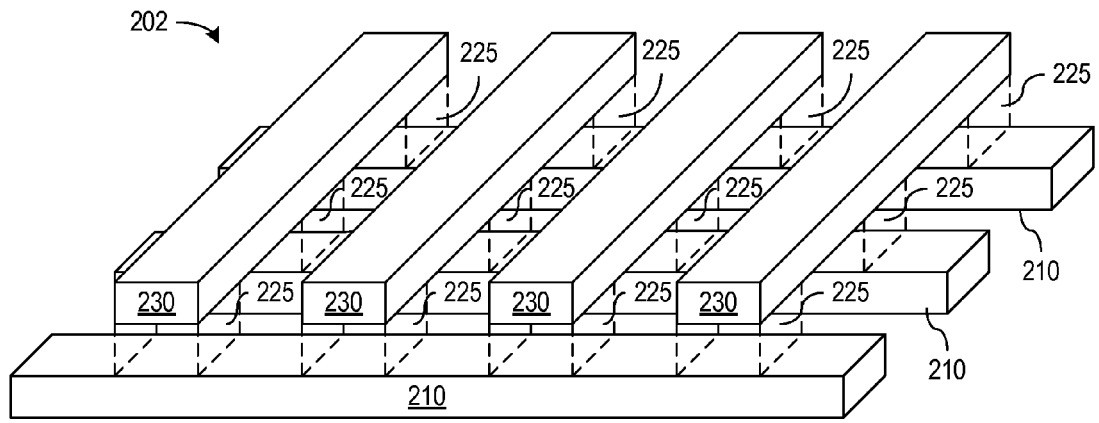

FIG. 2B shows a memristive array 202 that differs from memristive array 201 of FIG. 2A in that memristive layer 220 of memristive array 201 is replaced by memristive regions 225 respectively at the crossing points of bottom wires 210 and top wires 230. Memristive regions 225 can be laterally surrounded by an insulating material such as silicon dioxide that does not change in electrical or optical properties and preferably has a refractive index within the range of the refractive index of memristive regions 225. In memristive array 202, each memristive region is isolated, which can allow better control over the resolution of the refractive index pattern created in memristive array 202 when compared to memristive array 201. The resolution can also be made higher in memristive array 202 since the electrodes can be brought closer together and still maintain electrical isolation between separately programmed areas or pixels. Sharper refractive index transitions between pixels may be achieved as well.

Figure 3A:
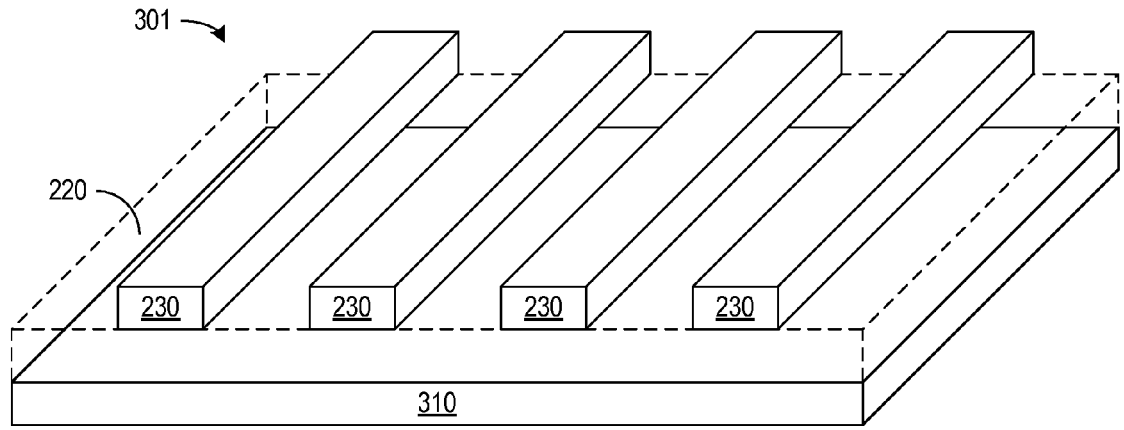
FIGS. 3A, 3B, and 3C show memristive arrays capable of operating as programmable linear gratings or diffractive optical elements in couplers/modulators in accordance with an embodiment of the invention.

Memristive arrays 201 and 202 both have the ability to produce two-dimensional patterns of variation in the conductivity, electrical permittivity, and refractive index between top wires 230 and bottom wires 210. This provides freedom to create patterns that diffract light in the desired directions for a wide range of incident light properties. In particular, the pattern of variation can be adapted to a range of wavelengths of incident light and to ranges of polar and azimuthal angles of incidence. However, if the direction of incident light on a diffractive array is known or limited such that a plane defined by the incident light and the direction of the waveguide is substantially perpendicular to the plane of the memristive array, a memristive array that is only able to produce patterns corresponding to linear diffraction gratings perpendicular to the waveguide would be sufficient. FIG. 3A, for example, shows a memristive array 301 that is able to produce in a memristive layer 220 patterns of variation that act as a line grating.

Memristive array 301 of FIG. 3A differs from memristive array 201 of FIG. 2A in that bottom wires 210 of memristive array 201 are replaced by a conductive bottom plate 310. Accordingly, when an electrical signal is applied to a selected top wire 230 to create an electric field between the selected top wire 230 and bottom plate 310, mobile charged dopants in memristive layer 220 can move and change the conductivity, electrical permittivity, and refractive index in the region of memristive layer 220 under the selected top wire 230.

Figure 3B:
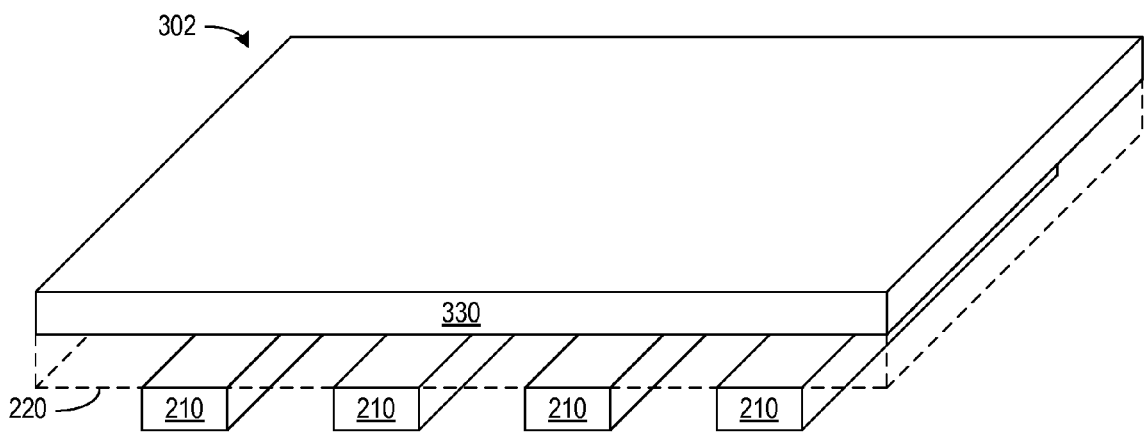

A memristive array 302 shown in FIG. 3B differs from memristive array 201 of FIG. 2A in that top wires 230 of memristive array 201 are replaced by a top plate 330, which is preferably made of a conductive transparent material. When an electrical signal is applied to a selected bottom wire 210 to create an electric field between the selected bottom wire 210 and top plate 330, mobile charged dopants in memristive layer 220 can move and change the conductivity, electrical permittivity, and refractive index in the region of memristive layer 220 above the selected bottom wire 230.

Figure 3C:
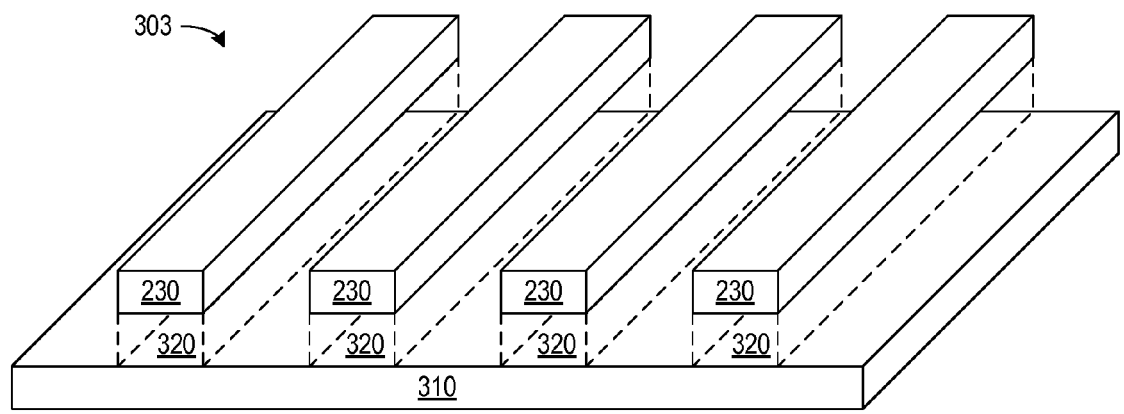

The blanket memristive layer 220 used in either memristive array 301 or 302 can be replaced with separated memristive regions in the areas where variations are controlled. FIG. 3C, for example, shows a memristive array 303 that is the same as memristive array 301, except that blanket memristive layer 220 of memristive array 301 is replaced by memristive regions 320 that are between plate 310 and respective top wires 230 and separated from each other by isolating material.

Memristive arrays 301, 302, and 303 of FIGS. 3A, 3B, and 3C do not have the same flexibility in creating grating patterns as do memristive arrays 201 and 202 of FIGS. 2A and 2B. However, such flexibility may be unnecessary when characteristics such as the wavelength and direction of the incident light are known when the memristive array is fabricated. In such cases, the widths and spacing of the top or bottom wires can be selected according to the known characteristics of the incident light, e.g., to match the pattern that will diffract the incident light. The desired pattern of variation in the memristive material can then be turned on, turned off, strengthened, or weakened by simultaneously applying the same signal to all wires (e.g., top wires 230 in memristive array 301 or 303 or bottom wires 210 in memristive array 302.) Further, in such cases the wires that define the variations in the memristive layer or regions do not need to be limited to straight wires, but can be replaced with conductive traces in the desired pattern of the variation in the memristive layer or regions.

Memristive arrays 201 and 202 of FIGS. 2A and 2B and memristive arrays 301, 302, and 303 of FIGS. 3A, 3B, and 3C can be fabricated using similar techniques that differ primarily when patterning is performed. In each case, fabrication can begin with depositing a bottom layer of conductive material such as a metal or highly doped semiconductor on a support substrate. Layers of the materials used in the memristive layer or regions are deposited on the structure. For example, a layer of the primary material (e.g., $TiO_2$) about 50-100 nm or more thick can be deposited on the underlying structure, and a layer of the source material (e.g., $TiO_{2-x}$) can be created at some point in this deposition process by varying the constituents of the deposition. A transparent conductor layer (e.g., a layer of ITO) can then be deposited on the structure including the memristive layer or regions. These layers may or may not be patterned according to the geometry shown in FIG. 2A, 2B, 3A, 3B, or 3C.

If bottom wires 210 are to be formed, e.g., as in memristive arrays 201, 202, or 302, the fabrication process patterns the bottom conductive layer either before the memristive layer is deposited (e.g., for fabrication of memristive arrays 201 or 302) or after the memristive layer is deposited (e.g., for fabrication of memristive array 202.) The patterning can be performed using either imprint technology or conventional photolithographic techniques to form the bottom wires, e.g., bottom wires 210, and if desired at least partially patterns the memristive layer. Regions between the bottom wires can then be filled with an insulator such as silicon dioxide or silicon nitride and the structure can be planarized if desired by chemical mechanical polishing (CMP) or other suitable technique before overlying layers are deposited.

If top wires 230 are to be formed as in memristive arrays 201, 202, 301, and 303, a patterning process is performed after deposition of the top electrode layer, and the removal of material in this patterning process can be stopped after etching through the top electrode layer for memristive arrays 201 and 301 or after etching through the memristive layer for memristive arrays 202 and 303. Alternatively, a liftoff process can be used to form the top wires 230.

A waveguide and peripheral circuits such as control and drive circuits can be fabricated in the same monolithic integrated structure or chip as the memristive array.

Although the invention has been described with reference to particular embodiments, the description is only an example of the invention's application and should not be taken as a limitation. For example, although references are made to optical devices, such description is not intended to limit such device to operation solely with visible light. Further, various adaptations and combinations of specific features of the embodiments disclosed are within the scope of the invention as defined by the following claims.

What is claimed is:

1. A device comprising:
   a waveguide; and
   a memristive array adjacent to the waveguide, wherein the memristive array is programmed to form a pattern that diffracts light and couples diffracted light into or out of the waveguide.

2. The device of claim 1, further comprising a gain medium arranged to amplify the diffracted light that is coupled into the waveguide.

3. The device of claim 2, wherein the gain medium resides in the waveguide.

4. The device of claim 1, wherein incident light passes through cladding of the waveguide before being diffracted by the pattern and coupled into the waveguide.

5. The device of claim 1, wherein the memristive array diffracts light in the waveguide to couple the diffracted light out of the waveguide.

6. The device of claim 1, further comprising a circuit coupled to apply electrical signals to the memristive array to alter an optical property of the memristive array and thereby change the pattern so as to alter the amount of diffracted light that is coupled into or out of the waveguide.

7. The device of claim 1, wherein the memristive array comprises:
   top wires adjacent to the waveguide;
   bottom wires that cross under the top wires; and
   memristive material between the top wires and the bottom wires at locations where the bottom wires cross the top wires.

8. The device of claim 1, further comprising a circuit coupled to apply electrical signals that program the memristive array to form the pattern.

9. The device of claim 8, wherein the circuit further applies electrical signals to the memristive array that alter the pattern to modulate the diffracted light.

10. A method for modulating an optical signal, comprising:
    directing incident light at a memristive array that is programmed to form a pattern that diffracts the incident light and couples diffracted light into a waveguide for the optical signal; and
    applying electrical signals to the memristive array to alter an optical property of the memristive array and thereby change the pattern so as to alter the amount of diffracted light that is coupled into the waveguide.

11. The method of claim 10, further comprising pumping a gain medium that amplifies the diffracted light coupled into the waveguide.

12. A method for modulating an optical signal, comprising:
    directing light through a waveguide adjacent to a memristive array that is programmed to form a pattern that diffracts the light out of the waveguide; and
    applying electrical signals to the memristive array to alter an optical property of the memristive array and thereby change the pattern so as to alter the amount of diffracted light that diffracted out of the waveguide.

* * * * *